United States Patent [19]

Brown et al.

[11] 4,412,868

[45] Nov. 1, 1983

[54] METHOD OF MAKING INTEGRATED CIRCUITS UTILIZING ION IMPLANTATION AND SELECTIVE EPITAXIAL GROWTH

[75] Inventors: Dale M. Brown; Kirby G. Vosburgh, both of Schenectady, N.Y.

[73] Assignee: General Electric Company, Schenectady, N.Y.

[21] Appl. No.: 333,596

[22] Filed: Dec. 23, 1981

[51] Int. Cl.³ .................. H01L 21/20; H01L 21/265; H01L 21/76

[52] U.S. Cl. ...................................... 148/1.5; 29/571; 29/576 B; 29/576 E; 29/576 W; 29/578; 148/175; 357/42; 357/49; 357/50

[58] Field of Search ................. 29/571, 576 B, 576 E, 29/576 W, 578; 148/175, 1.5; 357/42, 49, 50

[56] References Cited

U.S. PATENT DOCUMENTS

| | | | |
|---|---|---|---|
| 3,296,040 | 1/1967 | Wigton | 148/175 |
| 3,316,130 | 4/1967 | Dash et al. | 148/175 |
| 3,622,382 | 11/1971 | Karl et al. | 148/1.5 X |
| 3,634,150 | 1/1972 | Horn | 148/175 |
| 3,746,908 | 7/1973 | Engeler | 315/10 |
| 4,053,925 | 10/1977 | Burr et al. | 357/42 X |
| 4,101,350 | 7/1978 | Possley et al. | 148/175 |
| 4,320,409 | 3/1982 | Shoji | 357/42 |

OTHER PUBLICATIONS

Magdo et al., "Fabricating Complementary Transistors", *I.B.M. Tech. Discl. Bull.*, vol. 15, No. 7, Dec. 1972, pp. 2294-2295.

Das et al., "Structure for Lowering Power Dissipation ... Circuits", *I.B.M. Tech. Discl. Bull.*, vol. 22, No. 8B, Jan. 1980, pp. 3703-3704.

Izumi et al., "High Speed C-MOS ... by Ion Implantation", Proc. 11th Conf., Solid State Devices, Tokyo, (1979), *Jap. J. Appl. Phys.* 19, pp. 151-154, (1980).

Antipov, I., "Forming Complementary Field-Effect ... Transistors", *I.B.M. Tech. Discl. Bull.*, vol. 16, No. 8, Jan. 1974, pp. 2701-2703.

Thibodeaux, E., "Getting the Most Out of C-MOS ... Jobs", *Electronics*, Dec. 25, 1975, pp. 69-74.

Kahng, D., "Silicon Integrated Circuits-Part B", *Textbook, Applied Solid State Science*, Supplement #2, Academic Press, N.Y., 1981.

Taft, E. A., "Epitaxial Growth of Doped Silicon Using an Iodine Cycle", *J. Electrochem. Soc.*, vol. 118, No. 9, Sep. 1971, pp. 1535-1538.

*Primary Examiner*—W. G. Saba
*Attorney, Agent, or Firm*—Julius J. Zaskalicky; James C. Davis, Jr.; Marvin Snyder

[57] ABSTRACT

A method of making an integrated circuit is described. The method includes providing a substrate of single crystal silicon semiconductor material having low minority carrier lifetime, forming an insulating layer of silicon dioxide overlying a major surface of the substrate, forming a plurality of apertures in the insulating layer which expose a plurality of selected portions of the major surface of the substrate, and epitaxially growing a layer of silicon on each of the selected portions of the major surfaces of the substrate.

5 Claims, 14 Drawing Figures

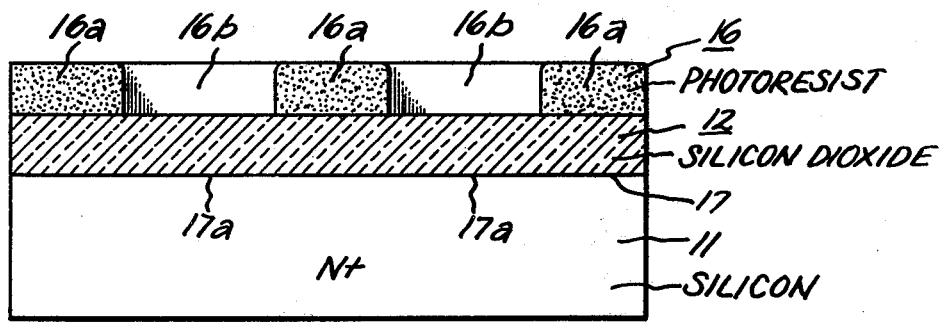
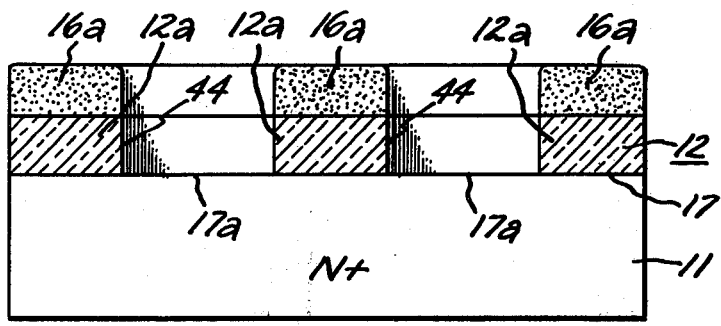
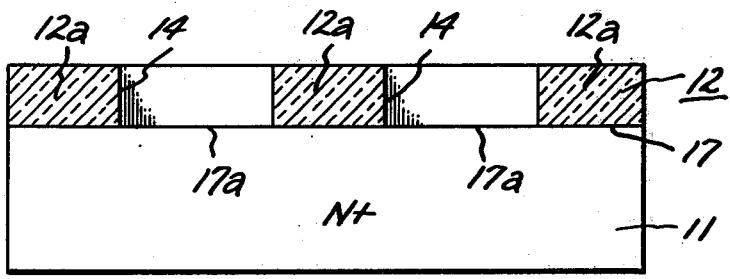
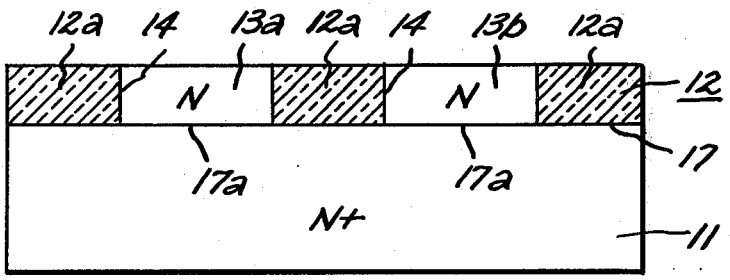
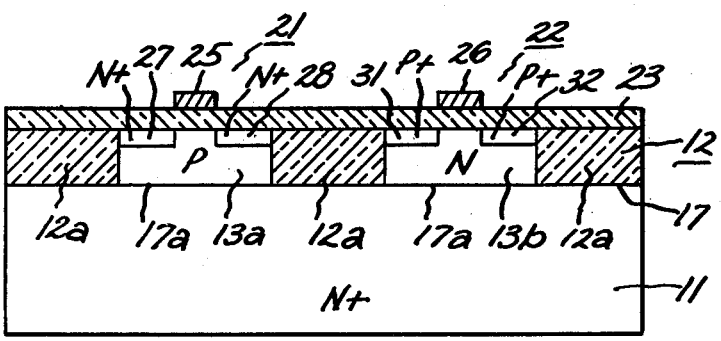

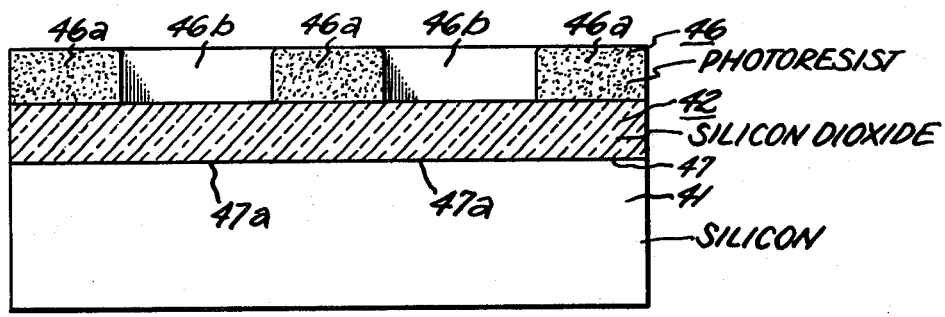
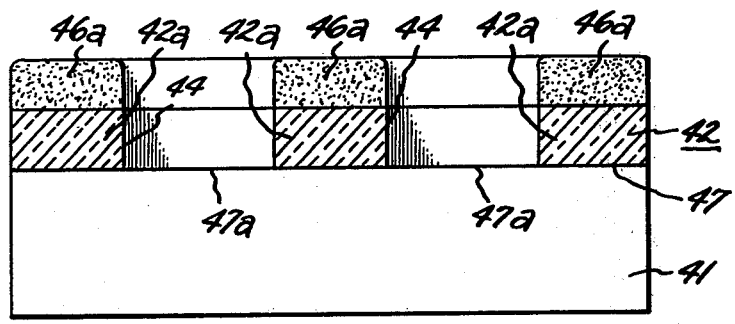
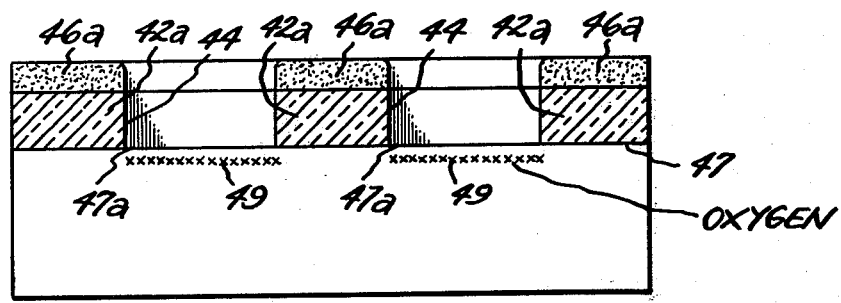
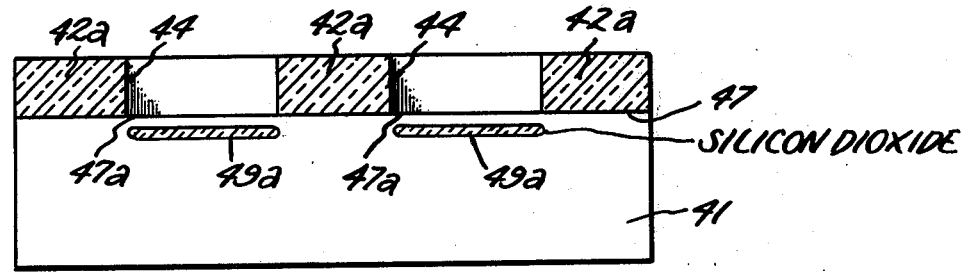
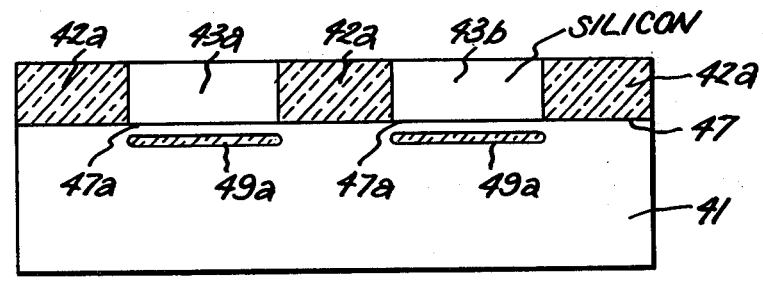

METHOD OF MAKING INTEGRATED CIRCUITS UTILIZING ION IMPLANTATION AND SELECTIVE EPITAXIAL GROWTH

The present invention relates in general to integrated circuits and in particular to integrated circuits utilizing insulating regions to electrically isolate adjacent devices thereof.

As the dimensions of elementary devices in VLSI (very large scale integrated) circuits become smaller, it is important to minimize the distance between adjacent devices while maintaining the electrical isolation between them. Oxide isolation is used to reduce the separation between adjacent devices which otherwise would be required to avoid undesired electrical coupling of adjacent devices. Such undesired coupling occurs, for example, when P channel and N channel transistor devices in a CMOS (complementary metal oxide semiconductor) integrated circuits are so closely spaced that they form parasitic bipolar transistor structures that can act electrically like a silicon controlled rectifier. "Latch-up" or undesired conduction occurs through the adjacent devices in response to transients such as bursts of radiation.

An object of the present invention is to provide a simple and inexpensive method of making integrated circuit devices with oxide isolation.

Another object of the present invention is to provide a simple and inexpensive method of making CMOS integrated devices in which latch-up is eliminated.

A further object of the present invention is to provide a simple method for forming active regions, in which active devices are incorporated, of improved planarity and increased density in integrated circuits.

In carrying out the method of the present invention in accordance with one embodiment thereof, there is provided a substrate of single crystal silicon semiconductor material having low minority carrier lifetime produced by a high concentration of an activator therein. An insulating layer of silicon dioxide is formed overlying the major surface of the substrate. A plurality of apertures are formed in the insulating layer to expose a plurality of selected portions of the major surface of the substrate. A layer of silicon semiconductor material is epitaxially grown on each of the selected portions of the major surface of the substrate by an iodine transport process.

In accordance with another feature of the present invention, each of the localized regions underlying the selected portions of the major surface of the substrate exposed by forming apertures in the layer of silicon dioxide is implanted with a sufficiently high dosage of oxygen and thereafter annealed to form a layer of silicon dioxide underlying the selected portion of the major surface thereby substantially isolating the epitaxially grown layer from the substrate.

The novel features which are believed to be characteristic of the present invention are set forth with particularity in the appended claims. The invention itself, both as to its organization and method of operation, together with further objects and advantages thereof, may best be understood by reference to the following description taken in connection with the accompanying drawings wherein:

FIGS. 3A–3E are cross sections of structures representing successive steps in one method of making the composite structure of FIGS. 1 and 2 in accordance with the present invention.

FIGS. 6A–6E are cross sections of structures representing successive steps in another method of making the composite structure of FIGS. 4 and 5 in accordance with the present invention.

Figure 1:
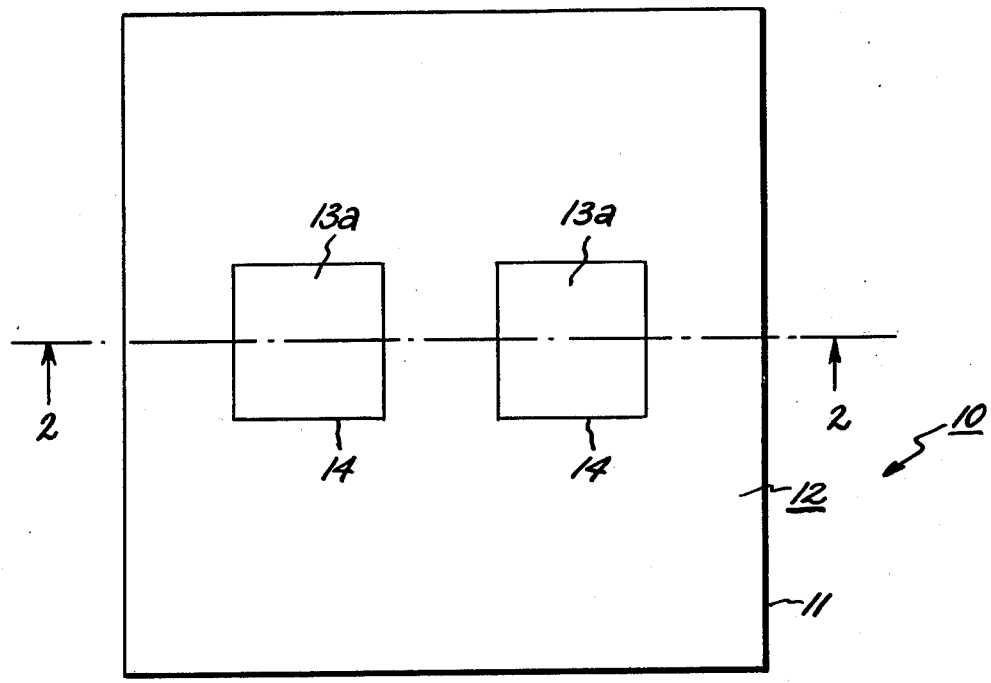
FIG. 1 is a plan view of a composite body representing a section of an integrated circuit showing a silicon substrate on which are formed epitaxial members of silicon surrounded by a thick isolating layer or body of silicon dioxide.
Figure 2:
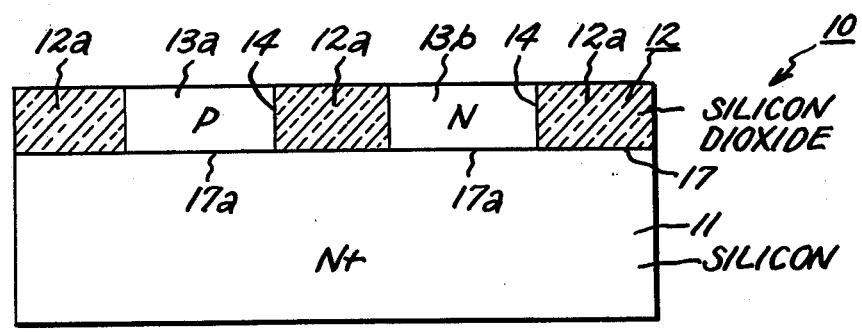
FIG. 2 is a cross sectional view of the section of the substrate of FIG. 1 taken along section lines 2—2 thereof.

Referring now to FIGS. 1 and 2, there is shown a composite body 10 representing a part of an integrated circuit made in accordance with the present invention. The composite body 10 includes a substrate 11 of silicon of low minority carrier lifetime of N-type conductivity on which is formed a layer or body 12 of silicon dioxide in which in turn is included a pair of silicon members 13a and 13b. The silicon members 13a and 13b are epitaxially grown upon selected portions 17a of the major surface 17 of the substrate underlying apertures 14 formed in the layer of silicon dioxide. The members 13a and 13b have an external surface substantially coplanar with the external surface of the layer 12 of silicon dioxide. Active components, such as field effect transistors (not shown), are formed in the epitaxial members 13a and 13b adjacent the major surfaces thereof. Each of the transistors is isolated from each other and from other active components formed on other epitaxial members similarly formed by the thick layer of silicon dioxide. To form the two transistors of a single CMOS circuit, silicon member 13a would be constituted of P-type conductive and silicon member 13b would be constituted of N-type, as will be described below.

A method of fabricating the composite structure of FIGS. 1 and 2 in accordance with the present invention will now be described in connection with FIGS. 3A–3E. Elements of FIGS. 3A–3E identical to elements of FIGS. 1 and 2 are identically designated. A substrate 11 of single crystal semiconductor material heavily doped with antimony to provide a resistivity of about 0.01 ohm-cm, a minority carrier lifetime of less than about 1 microsecond and N-type conductivity is provided. A major surface of the substrate is parallel to a (100) crystallographic plane of the substrate. A layer 12 of silicon dioxide about 2.5 microns thick is formed on the major surface of the substrate by techniques well known in the art, as shown in FIG. 3A. For example, the silicon substrate is exposed to an ambient of oxygen and water vapor at atmospheric pressure and at a temperature of about 1050° for a period of 17 hours. A layer 16 of a suitable ion erosion resist, about 1.0 micron thick, such as azide resist AZ1470 available from the Shipley Company of Newton, Mass., is applied over the layer of silicon dioxide. The layer 16 of resist is exposed and developed to provide retained portions 16a and removed portions 16b about 1 micron wide and overlying and in registry with selected portions 17a of the major surface of the substrate. The exposed portions of the layer of silicon dioxide unprotected by the retained portions 16a of the layer 16 of ion erosion resist material are reactive ion etched, for example, using CHF₃ to provide retained portions 12a and removed portions or apertures 14 of silicon dioxide. The apertures 14 expose selected portions 17a of the major surface of the substrate, as shown in FIG. 3B. What remains of the patterned layer of resist is removed in a suitable resist stripper, such as oxygen plasma, as shown in FIG. 3C. The entire structure is then etched in buffered hydrofluoric acid to remove a thin layer of surface oxide on the exposed portions of the silicon substrate and then washed in high purity water to remove any impurities from the surface of the oxide layer. The latter process prevents nucleation of silicon crystals on the oxide during the process of epitaxial growth of silicon members on the selected portions of the substrate, as will be described below.

The substrate is next placed in an enclosed vacuum reaction chamber (not shown) with the exposed selected surface portions 17a facing a wafer of silicon doped with phosphorus and having a resistivity of about 4 ohms-cm serving as a source of doped silicon. The source of silicon is placed a distance of 1.0 millimeter from the substrate. The substrate and the source are then heated inductively by r-f power to temperatures of 1000° C. and 950° C., respectively. Thereafter iodine vapor is introduced into the chamber and specifically between the substrate and the source of silicon to a pressure of about 1.0 millimeter of mercury while continuing the heating of the substrate and the source to cause silicon in the source to react with the iodine vapor to form a compound or compounds which diffuse to the hotter substrate where it is decomposed leaving silicon on the selected portions 17a of the major surface of the substrate. The dopant phosphorus also reacts with the iodine and is transported to silicon substrate at the same time. The process is allowed to proceed for about 1.0 minutes to grow epitaxially about 2.5 microns of silicon of N-type conductivity and high lifetime on each of the selected portions 17a of the major surface of the substrate. With the selected surface portions 17a of the substrate lying in a (100) crystallographic plane, flat top silicon members 13a and 13b are grown in the apertures 14 in the layer of silicon dioxide to produce the structure shown in FIG. 3D. Thus the outer surface of the epitaxial grown silicon members 13a and 13b are substantially coplanar with the outer surface of the insulating layer 12. The iodine vapor transport process is described in U.S. Pat. No. 3,316,130 by W. C. Dash and E. A. Taft, assigned to the assignee of the present invention and also in an article entitled "Epitaxial Growth of Doped Silicon Using an Iodine Cycle" by E. A. Taft in J. Electrochem. Soc., Electrochemical Technology, Sept. 1971, Vol. 118, No. 9, pages 1535–1538. Both of the above publications are incorporated herein by reference thereto.

Active components or devices, such as field effect transistors, may be formed in the silicon members 13a and 13b by conventional processes and would be isolated from each other and from other active components by the thick layer 12 of silicon dioxide and the heavily doped semiconductor material of the substrate 11. For example, to form a CMOS circuit including an N-channel transistor 21 and a P-channel transistor 22, N-type silicon members 13a is converted to P-type conductivity by diffusion of P-type activators therein. Thereafter a thin layer 23 of silicon dioxide is provided over the surfaces of the epitaxial members 13a and 13b. Gate electrodes 25 and 26 of suitable material such as doped polycrystalline silicon are provided on the thin layer 23 of silicon dioxide overlying the silicon members 13a and 13b, respectively. N-type source and drain regions are provided in the silicon member 13a in which the N-channel transistor 21 is formed and P-type source and drain regions 31 and 32 are provided in the silicon member 13b in which the P-channel transistor 22 is formed, as shown in FIG. 3E. The P+ source 31, the N-type member 13b and N+ substrate 11, the P-type member 13a and the N+ drain 28 form the elements of a silicon controlled rectifier. With a substrate 11 of N-type conductivity having low lifetime for minority carriers, the gain of the parasitic bipolar transistors of the silicon controlled rectifier is very low. Whenever avalanche breakdown or injection at the N+ or P+ diodes occurs the conduction or coupling of the parasitic bipolar transistors cannot occur thereby eliminating "latch-up". Increasing the doping concentration lowers minority carrier lifetime and in addition lowers the minority carrier diffusivity as is well known in the art. See, for example, Physics and Technology of Semiconductor Devices by A. S. Grove, page 110, FIG. 4.11, published by John Wiley and Sons, New York. Since the minority carrier diffusion length is the square root of the product of the diffusivity and minority carrier lifetime, the diffusion length is drastically reduced, thereby reducing the possibility of "latch-up". A minority carrier lifetime in the substrate of one microsecond would be sufficiently low for devices formed on epitaxial layers spaced ten microns apart; however, closer spacing may be desired. In such case, a lower lifetime would be provided by a higher concentration of activators in the substrate. The concentration levels of activators for reducing minority carrier lifetime are well known in the art. See, for example, Applied Solid State Science, Supplement No. 2, Silicon Integrated Circuits, Part B, edited by Dawon Kang, page 152, FIG. 24, published in 1981 by Academic Press, a subsidiary of Harcourt Brace Janovich, New York.

Figure 4:
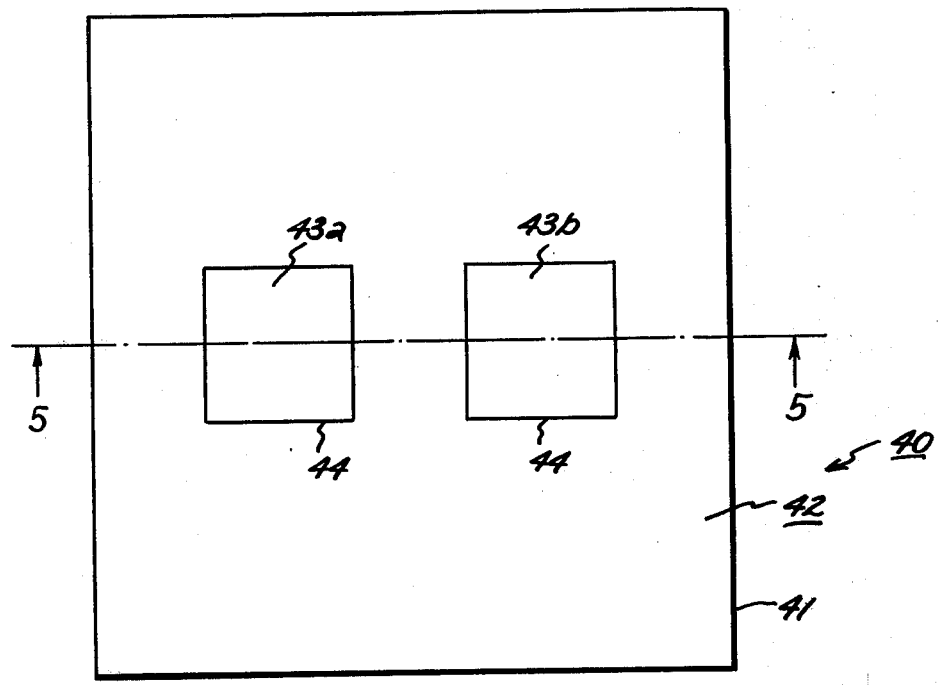
FIG. 4 is a plan view of another composite body representing a section of an integrated circuit showing a silicon substrate on which are formed epitaxial members of silicon surrounded by a thick isolating layer or body of silicon dioxide.
Figure 5:
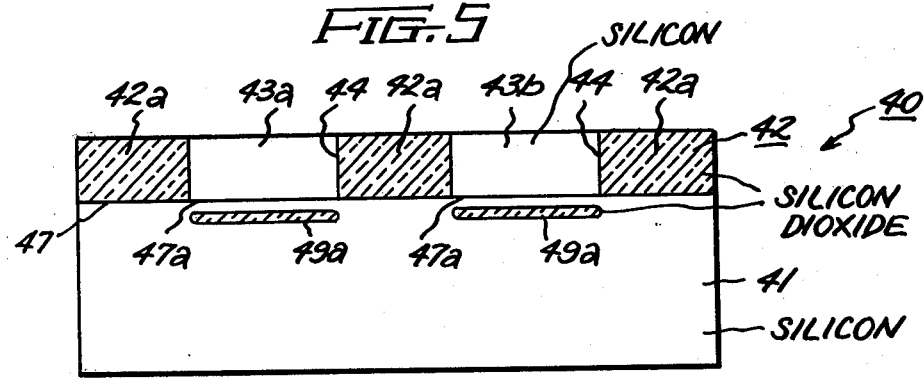
FIG. 5 is a cross-sectional view of the section of the substrate of FIG. 1 taken along section lines 2—2 thereof.

Referring now to FIGS. 4 and 5, there is shown a composite body 40 representing a part of an integrated circuit made in accordance with another embodiment of the present invention. The composite body 40 includes a substrate 41 of silicon upon which is formed a layer 42 or body of silicon dioxide in which in turn is included a pair of epitaxial members 43a and 43b of silicon. The silicon members 43a and 43b are epitaxially grown upon selected portions 47a of the major surface 47 of the substrate underlying apertures 44 formed in the layer of silicon dioxide. The silicon members 43a and 43b have an external surface substantially coplanar with the external surface of the layer 42 of silicon dioxide. Prior to formation of the silicon members 43a and 43b a thin layer 49a of silicon dioxide is formed in the substrate underlying each of the selected portions 47a of the major surface of the substrate. These thin layers 49a of silicon dioxide are formed by implanting oxygen, at a predetermined depth below the surface and thereafter annealing the body of silicon to form the thin layers 49a of silicon dioxide and also to repair the damage to the crystalline structure of the surface adjacent regions of the substrate exposed by the aperture. Active components, such as field effect transistors (not shown), are formed in the epitaxial members 43a and 43b adjacent the major surface thereof. Each transistor is isolated from each other and from other active components formed on other epitaxial members similarly formed by the thick layer 42 of silicon dioxide and by the underlying thin layers 49a of silicon dioxide.

A method of fabricating the composite structure of FIGS. 4 and 5 in accordance with the present invention will now be described in connection with FIGS. 6A–6E. Elements of FIGS. 6A–6E identical to elements of FIGS. 4 and 5 are identically designated. A substrate 41 of monocrystalline silicon semiconductor material of high resistivity and intrinsic conductivity type having a major surface 47 parallel to a (100) crystallographic plane thereof is provided. A layer 42 of silicon dioxide about 2.5 microns thick is formed on the major surface of the substrate by techniques well known in the art, as shown in FIG. 6A. A layer 46 of a suitable ion erosion resist about 1.0 micron thick, such as azide resist AZ1470 available from the Shipley Company of Newton, Mass., is applied over the layer 42 of silicon dioxide. The layer 46 of ion erosion resist is exposed and developed to provide a pattern having retained portions 46a and removed portions 46b about 10 micron wide overlying and in registry with selected portions 47a of the major surface 42 of the substrate. The exposed portions of the layer of silicon dioxide unprotected by the retained portions 16a of the layer of ion erosion resistant material are reactive ion etched, for example using $CHF_3$, to provide retained portions 42a of silicon dioxide while exposing selected portions 47a of the major surface of the substrate, as shown in FIG. 6B. In the next step of the process, ions 49 of oxygen are implanted in the substrate a short distance below the selected surface portions exposed by the apertures 44 in the layer of silicon dioxide, as shown in FIG. 6C. The selected portions 47a of the substrate are implanted with oxygen ions at 150 (keV) to a dose of about $1.2 \times 10^{18}$ cms.$^{-2}$. At this voltage ions of oxygen are implanted at a range of about 3700 Angstroms below the major surface of the substrate. What remains of the patterned layer 46 of resist is removed in a suitable resist stripper, such as oxygen plasma, as shown in FIG. 6D. Thereafter, the substrate is annealed at 1150° C. in nitrogen for 2 hours to repair damage to the surface adjacent regions of the substrate and to form a layer of silicon dioxide underlying each of said selected portions 47a of the major surface of the substrate. The entire structure is then etched in buffered hydrofluoric acid to remove a thin layer of surface oxide which may have been formed on the exposed selected portions 47a of the silicon substrate and thereafter the entire structure is washed in high purity water to remove any impurities on the surface of the layer 42 of silicon dioxide. The latter process prevents nucleation of the silicon crystals on the layer of silicon dioxide during subsequent epitaxial growth of the layers 43a and 43b of silicon on the selected portions 47a. The substrate is next placed in an enclosed vacuum reaction chamber (not shown) with the exposed selected surface portions 47a facing a wafer of silicon of high resistivity and intrinsic conductivity type serving as a source of doped silicon. The source of silicon is placed a distance of 1.0 millimeter from the substrate. The substrate and the source are then heated inductively by r-f power to temperatures of 1000° C. and 950° C., respectively. Thereafter iodine vapor is introduced into the chamber and specifically between the substrate and the source of silicon to a pressure of about 1.0 millimeter of mercury while continuing the heating of the substrate and the source to cause silicon in the source to react with the iodine vapor to form a compound or compounds which diffuse to the hotter substrate where it is decomposed leaving silicon on the selected portions 47a of the major surface of the substrate. The process is allowed to proceed for about 1.0 minute to grow epitaxially about 2.5 microns of silicon on each of the selected portions 47a of the major surface of the substrate. With the selected surface portions 47a of the substrate lying in a (100) crystallographic plane, flat top silicon members 43a and 43b are grown in the apertures 44 in the layer of silicon dioxide to produce the structure shown in FIG. 6E. Thus the outer surface of the epitaxial grown silicon members 43a and 43b are substantially coplanar with the outer surface of the insulating layer 42.

Active components or devices such as field effect transistors, may be formed in the silicon members 43a and 43b by conventional processes and would be isolated from each other and from other active components formed in other regions by the thick layer 42 of silicon dioxide and the thin layers 49a of silicon dioxide underlying each of the selected portions 47a of the major surface of the substrate 41.

A unique feature of the iodine transport process described above is that silicon is transported from the source to the substrate and deposited thereon without being deposited on the insulating layer overlying the surface of the substrate. A further feature of the iodine transport process is that donor activators, such as phosphorus, arsenic, and antimony, may be incorporated in the silicon source and transported to the substrate concurrently with transport of silicon to form epitaxial layers of N-type conductivity. Also acceptor activators, such as boron and gallium, may be incorporated in the source and transported to the substrate concurrently with silicon transport to form epitaxial layers of P-type conductivity thereon. When a source of intrinsic silicon semiconductor material is utilized, the epitaxial layer is constituted of intrinsic silicon. To form devices in such layers, the layers are appropriately doped N-type or P-type, as desired, by processes such as diffusion. Where an adjacent pair of epitaxial layers are to constitute the P-channel and N-channel transistors of a CMOS integrated circuit structure, one epitaxial layer is constituted of N-type silicon semiconductor material and the other epitaxial layer is constituted of P-type semiconductor material formed by doping processes such as described above.

While in the process described in connection with FIGS. 3A–3E, a substrate having a very high concentration of the donor activator, antimony, was utilized to provide a substrate of low minority carrier lifetime, of course, other donor activators could be utilized. Also, substrates having a very high concentration of acceptors such as boron could also be used and P-type layers grown thereon, if desired.

While in the process described in connection with FIGS. 3A–3E, a substrate with a high concentration of activators was utilized, a substrate having a low concentration of activators and hence a higher minority carrier lifetime could have been utilized and after apertures are provided in the layer of insulating material, the portions of the substrate underlying the selected portions of the major surface of the substrate exposed by the apertures could have been implanted with a dosage of activators of the desired high concentration of activators in excess of about $10^{18}$ to provide the desired minority carrier lifetime. After annealing the substrate the epitaxial layers of high lifetime would be epitaxially grown on the selected portions of the major surface exposed by the apertures. In the alternative, the substrate of low concentration of activators could have been implanted with a high concentration of activators in excess of about $10^{18}$ activators per $cm^3$ to provide the desired low minority carrier lifetime. An insulating layer of silicon dioxide would be formed on the major surface by chemical vapor deposition of silicon dioxide by processes well known in the art. Thereafter apertures would be formed in the insulating layer of silicon dioxide and layers of silicon would be epitaxially grown on the selected portions of the major surface of the substrate exposed by the apertures.

A particular feature of the iodine transport process described and utilized herein is that when surfaces parallel to a (100) crystallographic plane are provided in a silicon substrate for epitaxial growth of silicon thereon, the external surfaces produced in the epitaxial layers are parallel to the underlying major surface of the substrate. Also, epitaxial growth is accomplished without deposition of silicon on the insulating layer.

While the insulating layer provided on the major surface of the substrate was constituted of silicon dioxide, it will be understood that insulating layers constituted of other materials, such as silicon nitride, may be used.

As pointed out above, a particular advantage of the process of the invention is the formation of CMOS devices in which "latch-up" is eliminated. Another advantage is that the "bird beak" formation produced in conventional processes are eliminated. The "bird beak" formations are lateral protrusions of oxide produced when silicon dioxide isolation is produced by oxidation of silicon surrounding an active region of silicon which is masked with silicon nitride and in which devices are to be formed. Such lateral protrusions cause curvature to be produced in the surfaces of the active regions which reduces the usable portion of the active regions for the formation of active devices thereby reducing the density of devices which can be formed in a given area of silicon.

While the invention has been described in specific embodiments, it will be understood that modifications such as those described above, may be made by those skilled in the art, and it is intended by the appended claims to cover all such modifications and changes as fall within the true spirit and scope of the invention.

What is claimed is:

1. A method of making an integrated circuit comprising:
   providing a substrate of silicon semiconductor material,
   forming an insulating layer overlying a major surface of said substrate,
   forming a plurality of apertures in said insulating layer which expose a plurality of selected portions of said major surface of said substrate,
   implanting ions of oxygen in said substrate at a predetermined depth under each of said selected portions of said major surface of said substrate,
   annealing said substrate to repair the damage to the crytalline structure of the regions of said substrate adjacent said selected portions of said major surface caused by implanting said activators therein,
   said ions of oxygen being implanted in said substrate in a sufficiently high concentration and the annealing of said substrate being carried out at a temperature and for a time to convert said concentration of ions into a layer of silicon dioxide underlying each of said selected portions of said major surface of said substrate,
   growing epitaxially a layer of silicon on each of said selected portions of said major surface of said substrate.

2. The method of claim 1 which said insulating layer is silicon dioxide.

3. The method of claim 1 in which said ions of oxygen are implanted in said substrate in a concentration in excess of about $1.2 \times 10^{18}$ $cm^{-2}$.

4. The method of claim 1 in which said epitaxial layers are of the same conductivity type.

5. The method of claim 4 in which some of said epitaxial layers of the same conductivity type are converted into layers of opposite conductivity type by diffusion of opposite conductivity type dopants therein.

* * * * *